United States Patent [19]

Ibuhci

[11] Patent Number: 5,107,295
[45] Date of Patent: Apr. 21, 1992

[54] IMAGE FORMING APPARATUS
[75] Inventor: Yoshiaki Ibuhci, Nara, Japan
[73] Assignee: Sharp Kabushiki Kaisha, Japan
[21] Appl. No.: 578,493
[22] Filed: Sep. 6, 1990
[30] Foreign Application Priority Data

Sep. 13, 1989 [JP] Japan .................. 1-237859

[51] Int. Cl.[5] .................. G03B 27/32; G03B 27/52
[52] U.S. Cl. .................. 355/27; 355/77
[58] Field of Search .................. 355/27, 77; 430/138

[56] References Cited

U.S. PATENT DOCUMENTS

4,806,982  2/1989  Yamamoto et al. .................. 355/27
4,977,437  12/1990  Asai et al. .................. 355/27

*Primary Examiner*—Richard A. Wintercorn
*Attorney, Agent, or Firm*—Nixon & Vanderhye

[57] ABSTRACT

An image forming apparatus of pressure developing type includes a media sheet transporting device for transporting a media sheet in a rolled form through a latent image forming section to a pressure developping section. The image forming apparatus also includes a pair of pressure rollers disposed in the pressure developping section for selectively applying a pressure at a pressure applying point thereof. A pressure applying-/releasing device is provided to the pressure rollers for making the pressure rollers to release the pressure when a latent image formed portion of the media sheet is transported toward the pressure applying point and making the pressure rollers apply the pressure when a tip of the latent image formed portion arrives at the pressure applying point. The image forming apparatus further includes a receiver sheet supplying device for supplying an image receiver sheet in a cut sheet form to the pressure applying point, wherein the pressure rollers rotate and apply the pressure to the latent image formed portion and the supplied receiver sheet superposed on each other at the pressure applying point to perform a pressure developping operation.

8 Claims, 5 Drawing Sheets

IMAGE FORMING APPARATUS

BACKGROUND OF THE INVENTION

1. Field of the Invention

The present invention relates to an image forming apparatus of pressure developping type.

2. Description of the Related Art

As one of varuous kinds of image forming apparatus, there is an image forming apparatus of pressure developping type, using a photo-receiving media sheet, such as a photosensitive and pressure sensitive sheet, and an image receiver sheet for pressure developping.

Such a media sheet is coated with microcapsules. The microcapsule contains photohardening material and image forming material in its shell. The receiver sheet is coated with a developping material which reacts with the image forming material in the microcapsules of the media sheet and coloring the receiver sheet.

In such an image forming apparatus of pressure developping type, the operational principle is as following.

When the media sheet, on which a latent image i.e. a selective photo-hardened image is formed by exposure of an original image, and the receiver sheet is superposed on each other and applied with pressure by pressure rollers, the unhardened microcapsules are ruptured. Then the image forming material is flown out therefrom, then reacts with the developping material on the receiver sheet and color-develops the receiver sheet, resulting in forming a desirable image on the receiver sheet.

The media sheet is accommodated in a cartridge in a rolled form in order to prevent the light exposure and prevent the microcapsules from rupturing. The cartridge is mounted to the main body of the image forming apparatus.

The receiver sheet in a cut sheet form is accommodated in a sheet receiver supplying cassette, and is supplied one by one by a sheet supplying device of absorbing type so as not to scratch the coated surface thereof.

The receiver sheet is transported to a resist roller etc. and stopped once there. Then, the receiver sheet is transported from the resist roller etc. to the pressure rollers with a proper timing respect to the tip of the latent image formed portion of the media sheet.

As described above, the image forming apparatus of pressure developping type has a characteristic of a small size and simple structure apparatus since it does not require a photosensitive dram or the developping device which are required in other types of the image forming apparatus.

Accordingly, simplification and miniaturization of the apparatus is desirable and important subject in this type of image forming apparatus so as to make a good use of this characteristic.

However, in the above mentioned kind of the image forming apparatus, since the receiver sheet is stopped once before the pressure rollers in order to obtain the proper timing respect to the tip of the latent image formed portion of the media sheet, a device such as the resist roller etc., is disposed along the relatively short path of the receiver sheet, and the construction of devices such as sensors etc. for enabling the poroper timing is rather complicated, resulting in an increased number of the total components and a difficulty in the miniaturization, the simplification and the cost down of the apparatus.

SUMMARY OF THE INVENTION

It is therefore an object of the present invention to provide an image forming apparatus of pressure developping type which is suitable for the miniaturization and simplification of the apparatus.

According to the present invention, the object can be achieved by an image forming apparatus of pressure developping type including a media sheet transporting device for transporting a media sheet in a rolled form through a latent image forming section to a pressure developping section. The image forming apparatus also includes a pair of pressure rollers disposed in the pressure developping section for selectively applying a pressure at a pressure applying point thereof. A pressure applying/releasing device is provided to the pressure rollers for making the pressure rollers to release the pressure when a latent image formed portion of the media sheet is transported toward the pressure applying point and making the pressure rollers apply the pressure when a tip of the latent image formed portion arrives at the pressure applying point. The image forming apparatus further includes a receiver sheet supplying device for supplying an image receiver sheet in a cut sheeet form to the pressure applying point, wherein the pressure rollers rotate and apply the pressure to the latent image formed portion and the supplied receiver sheet superposed on each other at the pressure applying point to perform a pressure developping operation.

In the above mentioned image forming apparatus, the pressure rollers release the pressure when a latent image formed portion of the media sheet is transported toward the pressure applying point and apply the pressure when a tip of the latent image formed portion arrives at the pressure applying point, by the pressure applying-/releasing device. Then, when the receiver sheet is supplied by the receiver sheet supplying device to the pressure applying point, the pressure rollers rotate and apply the pressure to the latent image formed portion and the supplied receiver sheet superposed on each other at the pressure applying point to perform a pressure developping operation.

Accordingly, the tips of the latent image formed portion of the media sheet and the image receeicer sheet through a relatively short path can be set properly and speedily at the pressure applying point of the pressure rollers, where a device such as a resist roller etc. to stop the receiver sheet before the pressure rollers is omitted in the path of the receiver sheet. Thus, the present invention is quite suitable for the miniaturization and simplfication of the apparatus.

Further objects and advantages of the present invention will be apparent from the following description of the preferred embodiment of the invention as illustrated in the accompanying drawings.

BRIEF DESCRIPTION OF THE DRAWINGS

FIG. 3 which consists of FIGS. 3A and 3B are timing charts for setting the tips of the latent image formed portion of the media sheet and the image receiver sheet of the apparatus of FIG.1;

DETAILED DESCRIPTION OF THE PREFERRED EMBODIMENT

A preferred embodiment of the present invention will be described below with reference to the accompanying drawings.

Figure 1:
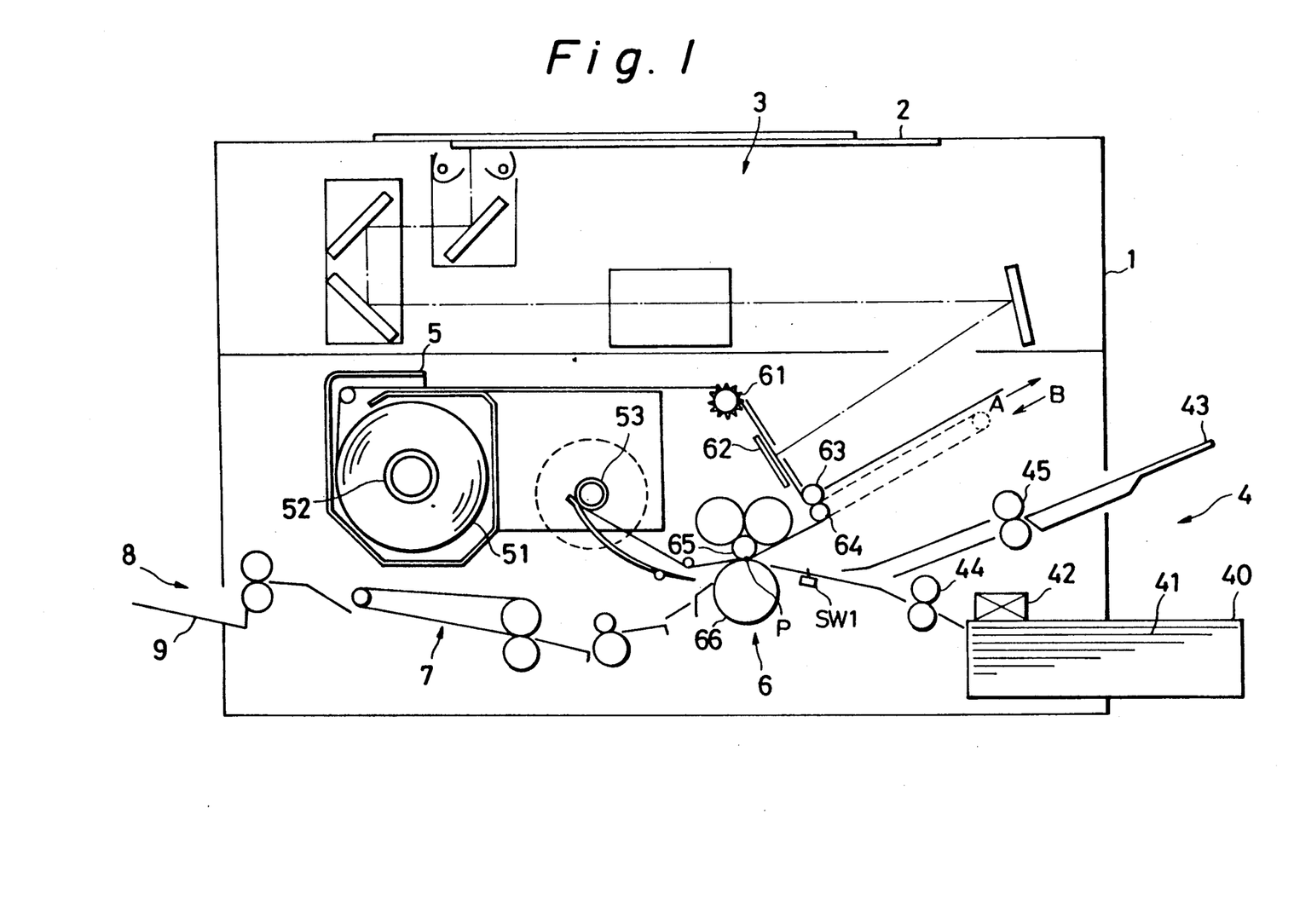
FIG. 1 is a schematic constructional view showing one embodiment of the present invention.

FIG. 1 shows a copying apparatus of a first embodiment according to the present invention.

In FIG. 1, the reference nummeral 1 designates a main body of the copying apparatus.

An original table 2 is provided on an upper face of the main body 1. There is provided an optical system 3 under the original table 2 in the main body 1. The optical system 3 includes a light source, a plurality of mirrors, a plurality of lenses, etc. to perform a latent image forming operation.

A media cartridge 5 for containing a media sheet 51 in a rolled form is mounted to said main body 1 at a position slightly left of the center of the main body 1. The media cartridge 5 is provided with a feeding shaft 52 and a winding up shaft 53. The unused media sheet 51 is rolled on the feeding shaft 52.

There are equipped adjacent to the media cartridge 5 a tractor roller 61, an exposure plate 62, a transporting roller 63, a buffer roller 64 and a pair of pressure rollers 65,66, through which the media sheet 51 is transported from the feeding shaft 52 to the winding up shaft 53 which winds up the used media sheet 51.

The pressure rollers 65,66 belong to a pressure developping section 6. The pressure rollers 65,66 are provided with a pressure applying/releasing means, not shown and described later, which selectively pressurizes the pressure rollers 65,66 so as to generate and not generate pressure between the pressure rollers 65,66 at a pressure applying point P.

A receiver sheet supplying section 4 is located at a right lower side of the main body 1. The supplying section 4 includes a receiver sheet supplying cassette 40 and an absorbing type sheet supplying device 42. The supplying cassette 40 contains a plurality of image receiver sheets 41 and is set to the main body 1. The receiver sheet 41 is supplied one by one by the supplying device 42 and then transported to the pressure developping section 6 by a pair of transporting rollers 44.

The supplying section 4 also includes a receiver sheet supplying table 43. A receiver sheet is manually supplied one by one by an operator from the supplying table 43, and then transported to the pressure developping section 6 by a pair of transporting rollers 45.

A timing detection switch SW1 is equipped in the path of the receiver sheet before the pressure rollers 65,66. The switch SW1 detects the tip of the receiver sheet transported therethrough to the pressure rollers 65,66, while a receiver sheet transport controlling device described later controls the timing of starting of the transporting operation of the transporting rollers 44 and 45.

A lustering device 7 is provided at a left side of the pressure developping section 6. In the lustering device 7, the receiver sheet 41 becomes luster by a heat applying process.

A receiver sheet discharging section 8 is provided at a left side of the main body 1 and includes a discharging tray 9. The receiver sheet 41 on which a desirable image is formed and which has passed through the lustering device 7 is discharged from the main body 1 onto the discharging tray 9.

The construction of the pressure developping section 6 and the supplying section 4 will be explained in more detail with reference to FIG. 2 which is a block diagram of the pressure developping section 6 and the receiver sheet transporting section.

Figure 2:
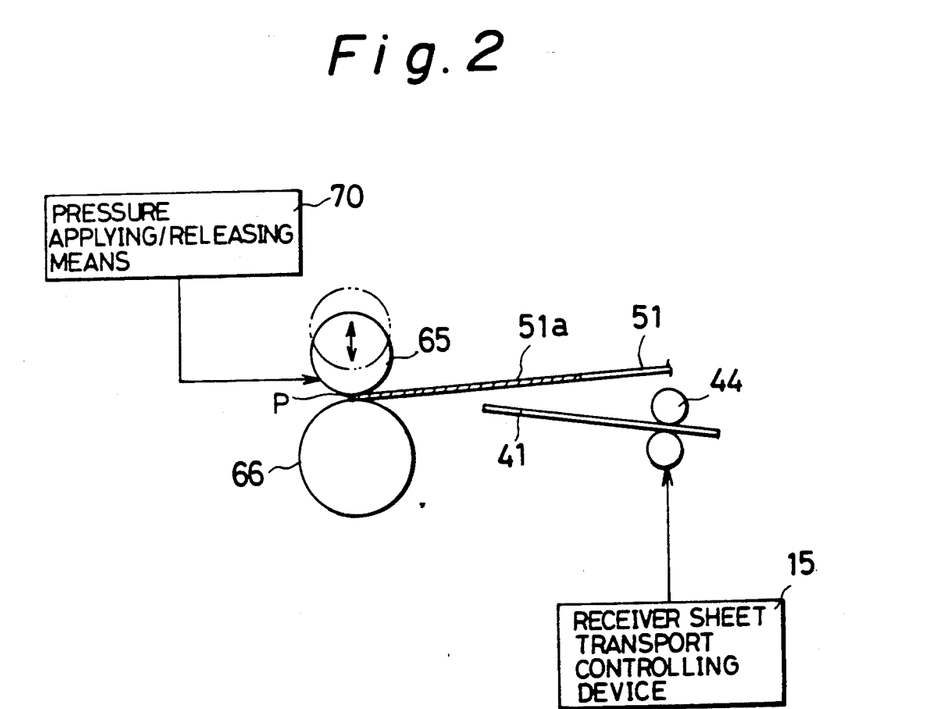
FIG. 2 is a block diagram of the pressure developping section and the image receiver sheet transporting section of the apparatus of FIG. 1.

In FIG. 2, the pressure roller 65 is connected with a pressure applying/releasing means 70 which is controlled by a control circuit as described later. The pressure applying/releasing means 70 selectively moves the pressure roller 65 toward the pressure roller 66 so that the pressure rollers 65,66 apply the pressure to the media sheet 41 and the receiver sheet 51 therebetween at the point P. The pressure applying/releasing means 70 is also adapted to move the pressure roller 65 apart from the pressure roller 66 so as to release the pressure at the point P.

The pressure roller 66 is fixed with respect to the path of the media sheet 51 so as to hold the pressure against the pressure roller 65 at the point P.

A receiver sheet transport controlling device 15 is connected to the transporting rollers 44. The transport controlling device 15 selectively rotates and not rotates the transporting rollers 44 so as to transport the receiver sheet 41 to a desired position.

The pressure applying/releasing means 70 and the transport controlling device 15 control the pressure rollers 65,66 and the transporting rollers 44 as following.

When the pressure roller 65 is at a pressure released position as indicated by the broken line, the latent image formed portion 51a of the media sheet 51 is transported to the point P. When the tip of the latent image formed portion 51a arrives at the point P, the pressure applying-/releasing means 70 moves the pressure roller 65 toward the pressure roller 66 and set the pressure roller 65 at a pressure applying position as indicated by the solid line so as to pinch and stop the receiver sheet 51.

On the other hand, the transport controlling device 15 rotates and stops the transporting rollers 44 so as to transport and stop the receiver sheet 41 such that the tip of the receiver sheet 41 arrives at the point P. When the tip of the latent image formed portion 51a and the tip of the receiver sheet 41 are coincided with each other at the point P, then the pressure rollers 65,66 in the pressure applying condition rotate so as to start the pressure developping operation.

The operation of the copying apparatus of FIG. 1 will be explained below.

An original to be copied is placed on the original table 2 and the copying operation starts.

The optical system 3 scans the original so as to obtain a reflection light corresponding to an image information on the original. At this time, the buffer roller 64 is moved in a direction indicated by an arrow A so as to pull out the unused media sheet 51 from the media cartridge 5, so that the unused media sheet 51 is exposed by the reflection light at the exposure plate 62 as the media sheet 51 moves with respect to the exposure plate 62. Thus, a selective hardening image i.e. an latent image is formed on the media sheet 51.

When the latent imge forming process is completed at the exposure plate 62, the buffer roller 64 is moved in a direction indicated by an arrow B so as to transport the latent image formed portion toward the pressure developping section 6.

Then, the winding up shaft 53 rotates so as to transport the media sheet 51 until the tip of the latent image formed portion arrives at the pressure rollers 65,66. Then, the pressure rollers 65,66 are pressurized by the pressure applying/releasing means.

The receiver sheet 41 is transported one by one to the pressure developping section 6 by the supplying device 42 and the transporting rollers 44. At this time, the receiver sheet 41 reaches the point P in a predetermined time period $\Delta t$ after the switch SW1 is turned ON as described later.

At this time, since the tip of the latent image formed portion of the media sheet is already at the point P, such a condition is obtained that the tip of the latent image formed portion of the media sheet and the tip of the receiver sheet are superposed on each other at the point P. Accordingly, at a time when the predetermined time period $\Delta t$ has passed after the switch SW1 is turned ON, the pressure rollers 65,66 start rotating so as to start the pressure developping process. When the pressure is applied by the pressure rollers 65,66 to the media sheet, the unhardened microcupsules on the media sheet are broken to flow out the image forming material thereof, which reacts with the developping material on the receiver sheet 41 to color the receiver sheet 41.

Then, the used media sheet which has finished its developping operation is wound up by the winding up shaft 53. The image formed receiver sheet 41 goes through the heat applying process in the lustering device 7, and is then discharged out to the discharging tray 9.

As described above, the tips of the latent image formed portion 51a and the receiver sheet 41, which is directly transported from the transporting rollers 44, can be properly set for the pressure developping operation.

The timing of setting the tips of the latent image formed portion and the receiver sheet 41 in the copying apparatus of FIG. 1, by use of the switch SW1, will be explained hereinbelow, with reference to FIG. 3.

Figure 3A:
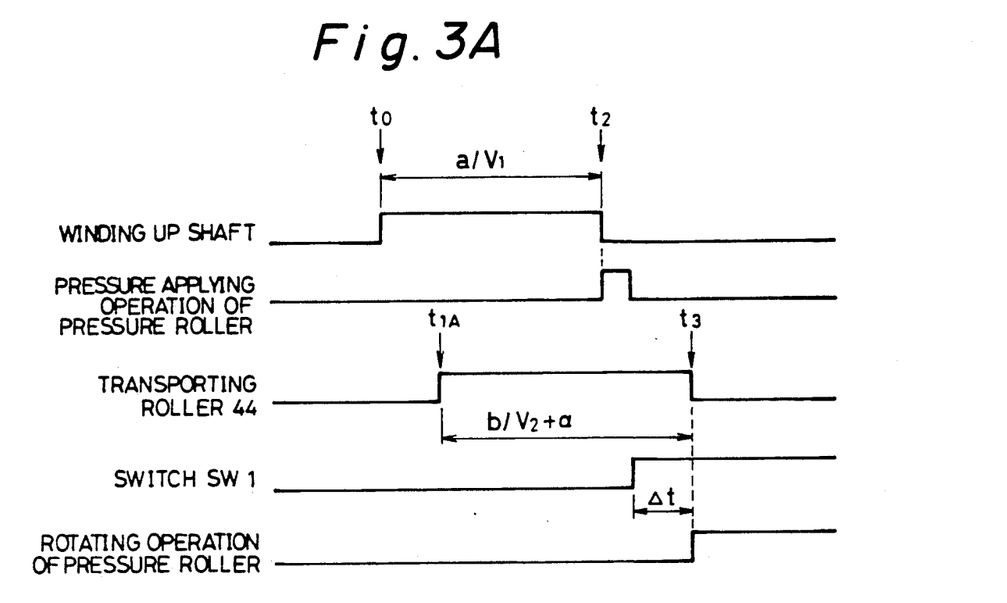
Figure 3B:
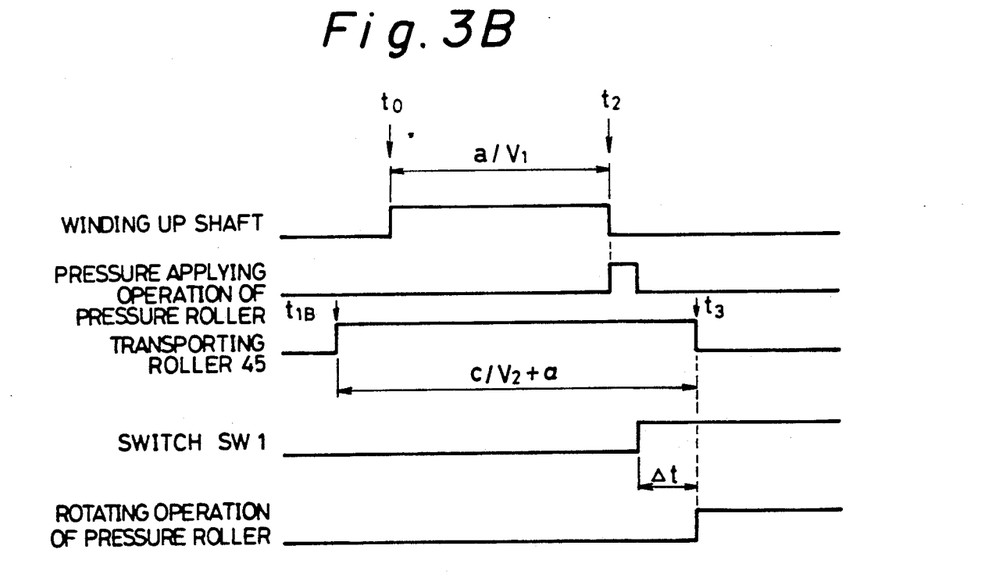

FIGS. 3A and 3B are timing charts for setting the tips of the latent image formed portion and the receiver sheet 41 in case of using the supplying cassette 40 and in case of using the supplying table 43 respectively. In each of FIGS. 3A and 3B, each state of the winding operation of the winding shaft 53, the pressure applying operation of the pressure rollers 65,66, the transporting operation of the transporting rollers 44,45, the switching operation of the switch SW1, and the rotating operation of the pressure rollers 65,66, are shown versus time by two levels thereof respectively, in which the high level means that the operation is ON or being performed, and the low level means that the operation is OFF or being stopped.

In FIGS. 3A and 3B, the transporting speed of the media sheet 51 is defined as V1, and the transporting speed of the receiver sheet 41 as V2. The distance from the point P to the tip of the latent image formed portion of the media sheet 51 is defined as a, the distance from the point P to the transporting rollers 44 as b, and the distance from the point P to the transporting rollers 45 as c. The time, which is required for the receiver sheet 41 to arrive at the point P after turning on the switch SW1, is defined as $\Delta t$.

In FIG. 3A, when the latent image forming process is finished, the winding up shaft 53 starts its winding operation at the time t0 and transports the media sheet 51. Then, when the time period of a/V1 has passed after the time t0, the tip of the latent image formed portion thereof arrives at the point P. At this time t2, the winding shaft 53 stops its winding operation, and at the same time, the pressure roller 65 starts to move toward the pressure roller 66 and set at the pressure applying position so as to apply pressure to the media sheet 51 after a short time period.

On the other hand, the receiver sheet 41 is transported to the transporting rollers 44 before the time t0 in advance. Then, when a predetermined time period has passed after the time t0, the transporting rollers 44 start the transporting operation at the time t1A. Thus, the receiver sheet 41 is transported and arrives at the point P at the time t3 when the time period of (b/V2)+$\alpha$ has passed after the time t1A. The $\alpha$ represents the sheet supplying delay time of the receiver sheet 41 due to the slipping etc. of the receiver sheet 41. At this time t3, the pressure rollers 65,66 are already in the pressure applying condition.

The time t1A is determined and set so that the time t3 is made substantially same as the time when the time period $\Delta t$ has passed after the switch SW1 is turned on. Accordingly, the pressure developping operation can be speedily and properly started with little or no loss time by starting the rotating operation of the pressure rollers 65,66 when the time $\Delta t$ has passed after the switch SW1 is turned on.

In the similar manner as the above described case of using the supplying cassette 40, the operation of using the supplying table 43 can be performed as shown in FIG. 3B.

In FIG. 3B, in the same manner as in FIG. 3A, the pressure roller 65 set at the pressure applying position.

On the other hand, the receiver sheet 41 is transported to the transporting rollers 45 before the time t0 in advance, and also before the time t0, the transporting rollers 45 start the transporting operation at the time t1B. Thus, the receiver sheet 41 is transported and arrives at the point P at the time t3 when the time period of (c/V2)+$\alpha$ has passed after the time t1. At this time t3, the pressure rollers 65,66 are already in the pressure applying condition.

The time t1B is determined and set so that the time t3 is made substantially same as the time when the time period $\Delta t$ has passed after the switch SW1 is turned on. Accordingly, the pressure developping operation can be speedily and properly started.

Figure 4:
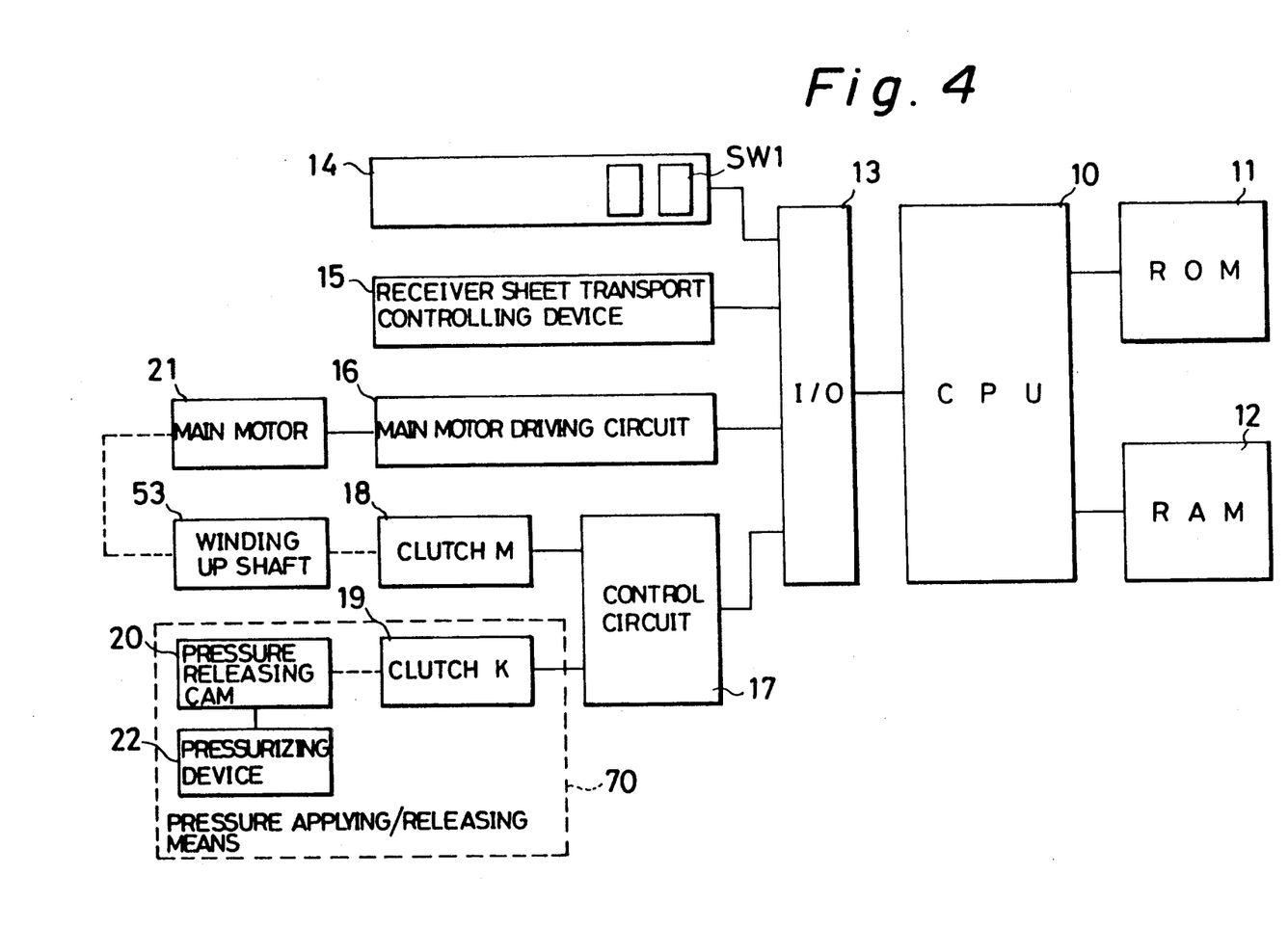
FIG. 4 is a block diagram of the controlling system of the apparatus of FIG.1.

FIG. 4 shows a main portion of the controlling system of the copying apparatus of FIG. 1.

In FIG. 4, the controlling system includes a CPU (central processor unit) 10, a ROM (read only memory) 11 and a RAM (random access memory) 12. The CPU 10 executes the overall control of the copying apparatus. The ROM 11 is connected with the CPU 10 and stores the control program in advance. The RAM 12 is connected with the CPU 10 and serves the working area for the CPU 10.

The controlling system also includes a I/O (input/output device) 13 connected with the CPU 10. The CPU 10 is connected with a sensor group 14 which includes the switch SW1, the transport controlling device 15, a main motor driving circuit 16 and the control circuit 17 through the I/O 13. The main motor driving circuit 16 drives a main motor 21 which rotates winding up shaft 53 via a clutch M 18. The clutch M 18 transmits a rotating force to the winding up shaft 53 by engaging accroding to a control signal from the control circuit 17.

The control circuit 17 is connected with the pressure applying/releasing means 70, which includes a clutch K 19, a pressure releasing cam 20 and a pressurizing device 22. The pressurizing device 22 consists of a spring member etc. loaded so as to press the shaft of the pressure roller 65 toward the pressure roller 66.

The pressure applying/releasing means 70 is adapted to release the pressure at the point P such that, when the pressure releasing cam 20 is rotated by the clutch K 19 being engaged according to the control signal from the control circuit 17, the pressure releasing cam 20 moves the pressure roller 65 away from the pressure roller 66.

The pressurizing device 22 may consist of an electric actuator, a pneumatic actuator, a diaphragm type actuator or a solenoid type actuator controlled by the control circuit 17 to move the pressure roller 65 toward the pressure roller 66 so as to pressurize the pressure rollers 65, 66, according to the control signal from the control circuit 17.

In the copying operation, the CPU 10 reads the control program from the ROM 11 and the RAM 12, receives data from the sensor group 14 and outputs various kind of control signals to the transport controlling device 15, the main motor driving circuit 16 and the control circuit 17 via I/O 13 so as to execute the copying operation according to the read program.

Figure 5:
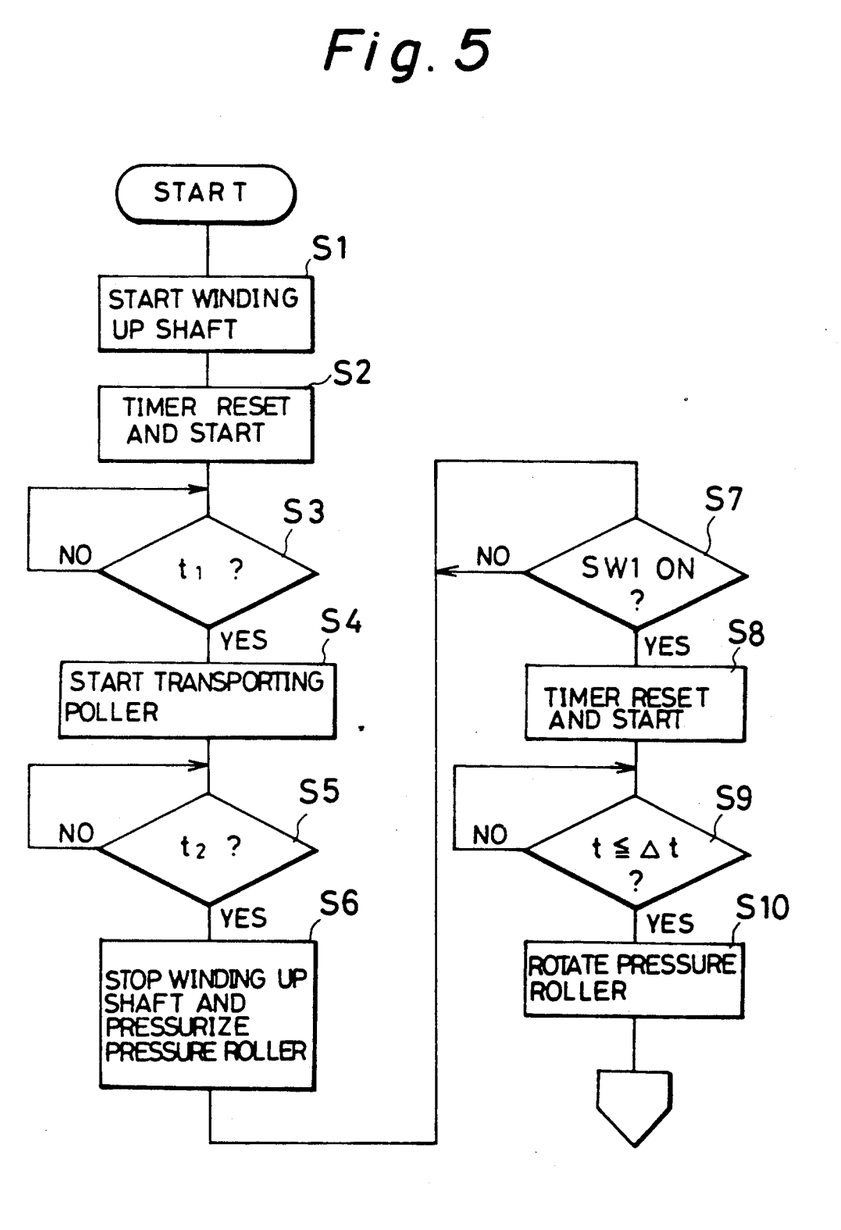
FIG. 5 is a flow chart of the pressure developping operation in the apparatus of FIG. 1.

The pressure developping operation with setting the tips of the latent image formed portion 51a and the receiver sheet 41 in case of using the supplying cassette 40 will be explained below with reference to the flow chart of FIG. 5.

The flow starts after the latent image is completed by the latent image forming process.

At the time t0, the winding up shaft 53 starts rotating (S1). The timer of the control system is reset and start (S2). Then, the timer keeps watching the time t1, which is determined and set in advance as mentioned before (S3). When the time t1 comes, the flow branches to the step S4 and the transport rollers 44 start rotating (S4). Then, the timer keeps watching the time t2 (S5). Then, when the time t2 comes, the flow branches to the step S6. In the step S6, the winding up shaft 53 stops rotating and at the same time the pressure rollers 65,66 are pressurized by the pressure applying/releasing means 70. Then it is judged whether the SW1 is turned on or not by the receiver sheet 41 (S7). When the SW1 is turned on, the flow branches to the step S8. In the step S8, the timer is reset and start. Then the timer counts the time period after resetting (S9). When the time Δt has passed, the flow branches to the step S10. In the step S10, the pressure rollers 65,66 start rotating and the pressure developping is executed.

In the above described steps, the steps S1, S2, S5 and S6 are related to the operation of pressurizing the pressure rollers 65,66, while the steps S2, S3 and S4 are related to the operation of transporting the receiver sheet 41.

As mentioned above, in the pressure developping operation, the tips of the latent image formed portion of the media sheet 51 and the receiver sheet 41 can be set speedily and properly at the point P of the pressure rollers 65, 66.

Many widely different embodiments of the present invention may be constructed without departing from the spirit and scope of the present invention. It should be understood that the present invention is not limited to the specific embodiments described in this specification, except as defined in the appended claims.

What is claimed is:

1. An image forming apparatus of pressure developping type, comprising:
 a media sheet transporting means for transporting a media sheet in a rolled form through a latent image forming section to a pressure developing section;
 a pair of pressure rollers disposed in said pressure developing section for selectively applying a pressure at a pressure applying point thereof;
 a pressure applying/releasing means provided to said pressure rollers for making said pressure rollers to release said pressure when a latent image formed portion of said media sheet is transported toward said pressure applying point and making said pressure rollers apply said pressure when a tip of said latent image formed portion arrives at said pressure applying point; and
 a receiver sheet supplying means for supplying an image receiver sheet in a cut sheet form to said pressure applying point, said pressure rollers rotating and applying said pressure to said latent image formed portion and said supplied receiver sheet superposed on each other at said pressure applying point to perform a pressure developing operation.

2. An image forming apparatus according to claim 1, further comprising a timing detection switch disposed in a path of said receiver sheet for detecting said receiver sheet passing therethrough.

3. An image forming apparatus according to claim 2, wherein said pressure rollers start rotating in a predetermined time period after said detection switch detects said receiver sheet.

4. An image forming apparatus according to claim 1, wherein said receiver sheet supplying means comprises transporting rollers disposed in a path of said receiver sheet.

5. An image forming apparatus according to claim 4, wherein said transporting rollers start rotating in a predetermined time period before said pressure rollers start rotating.

6. An image forming apparatus according to claim 1, wherein said media sheet is once stopped when said media sheet arrives at said pressure applying point until said receiver sheet arrives at said pressure applying point.

7. An image forming apparatus according to claim 1, wherein said media sheet transporting means comprises a winding up shaft of a media cartridge, which accommodates said media sheet, for winding up one end of said media sheet.

8. An image forming apparatus according to claim 1, further comprising a control means for controlling each timing of starting and stopping of each operation of said media sheet transporting means, said pressure rollers, said pressure applying/releasing means and said receiver sheet supplying means.

* * * * *

UNITED STATES PATENT AND TRADEMARK OFFICE
CERTIFICATE OF CORRECTION

PATENT NO. : 5,107,295
DATED : 21 April 1992
INVENTOR(S) : Yoshiaki IBUCHI

It is certified that error appears in the above-identified patent and that said Letters Patent is hereby corrected as shown below:

On the cover page, at second line of heading and at data item [75] correct the spelling of the inventor's last name from "Ibuhci" to --Ibuchi--.

Signed and Sealed this

Twenty-sixth Day of October, 1993

Attest:

BRUCE LEHMAN

Attesting Officer

Commissioner of Patents and Trademarks